(12) United States Patent
Yost et al.

(10) Patent No.: US 6,249,115 B1
(45) Date of Patent: Jun. 19, 2001

(54) METHOD OF CONTROLLING BRIGHTNESS AND CONTRAST IN A RASTER SCAN DIGITAL OSCILLOSCOPE

(75) Inventors: Jeff W. Yost, Tigard; Paul M. Gerlach, Beaverton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/106,385

(22) Filed: Jun. 25, 1998

(51) Int. Cl.[7] ................................................... G01R 13/20
(52) U.S. Cl. ............................................. 324/121; 324/88
(58) Field of Search ........................... 324/121, 88, 379, 324/378, 380; 345/121, 509, 134, 334, 339, 522

(56) References Cited

U.S. PATENT DOCUMENTS

| | | | |
|---|---|---|---|
| 4,364,080 | * | 12/1982 | Vidovic .............................. 324/88 X |
| 4,816,813 | * | 3/1989 | Furno et al. ......................... 340/724 |
| 5,440,676 | * | 8/1995 | Alappat et al. ...................... 395/143 |
| 5,481,193 | * | 1/1996 | Mueller et al. ...................... 324/379 |
| 5,532,714 | * | 7/1996 | Knapp et al. ........................ 324/114 |

* cited by examiner

*Primary Examiner*—Safet Metjahic
*Assistant Examiner*—T. R. Sundaram
(74) *Attorney, Agent, or Firm*—John Smith-Hill; Thomas F. Lenihan

(57) ABSTRACT

A raster scan digital signal acquisition and waveform display instrument displays a dot representing a signal event with a color parameter in accordance with the value of a corresponding data word stored in a raster scan memory. A user interface control element supplies a single color parameter control value from which multiple independent control values for influencing the values of the data words stored in the raster scan memory in response to the single color parameter control value are generated.

17 Claims, 2 Drawing Sheets

METHOD OF CONTROLLING BRIGHTNESS AND CONTRAST IN A RASTER SCAN DIGITAL OSCILLOSCOPE

BACKGROUND OF THE INVENTION

This invention relates to a method of controlling brightness and contrast in a raster scan digital oscilloscope.

An oscilloscope presents the activity of an electrical signal to its user. In the traditional analog oscilloscope, the waveform display is generated by an electron beam incident on a phosphor coating on the face plate of a cathode-ray tube. The point of incidence of the electron beam on the face plate sweeps horizontally (X direction) at a uniform speed across the face plate and is deflected vertically (Y direction) as a function of the magnitude of the signal being observed.

Two variables that influence the appearance of a waveform display are the brightness of the display (the overall light intensity emitted by the display) and the contrast of the display (the ratio of the light intensity emitted by the most brightly illuminated elements of the display to the light intensity emitted by the dimmest illuminated elements of the display).

The user interface of the traditional analog oscilloscope has a single knob for controlling the brightness with which a waveform is displayed. This knob, which is typically labelled as an intensity control, controls the current supplied to the electron gun of the cathode ray tube. For a given setting of the intensity control knob, the intensity with which a segment of the waveform is displayed depends on the slope of the segment and the frequency with which the event represented by the segment occurs. At a low setting, the user might not be able to see the waveform features of an infrequent event or a particularly fast edge. Accordingly, the user may increase the setting until a complete waveform can be seen, and at that point there will generally be a significant contrast between the slower edges and the faster edges, and between more frequent events and less frequent events. By increasing the intensity further, the intensity of all segments of the waveform is increased, until when maximum intensity is approached, the intensity of the more frequent events is limited by the maximum current value and the intensity of the less frequent events continues to increase and so the contrast is reduced.

The traditional analog oscilloscope is a common measurement instrument. Many technicians and engineers are familiar with the manner in which the display changes in response to turning of the intensity control knob.

In a multi-channel oscilloscope, different hues may be associated with the signal channels respectively: green may be associated with one channel and red with another channel. When the intensity control knob is turned in the counterclockwise direction, associated with decreasing intensity, the effect is to reduce the saturation with which a waveform of a given hue is displayed.

In a color temperature display, different hues may be associated with different intensity ranges: redder hues may be associated with higher intensity ranges and bluer hues with lower intensity ranges. When the intensity control knob is turned in the clockwise direction, the effect is to translate the hue with which a given intensity is associated toward the red end of the spectrum.

Referring to FIG. 1, a conventional raster scan digital oscilloscope includes a display panel 10 having a two-dimensional array of pixels, with each pixel location being uniquely defined by a row number and a column number. The oscilloscope also includes a raster scan memory 14 having a two-dimensional address space. The memory locations in the raster scan memory map on a one-to-one basis with the pixel locations of the display panel 10. The state of each pixel depends on the contents of the corresponding memory location in the raster scan memory 14.

In the case of the oscilloscope shown in FIG. 1, the raster scan memory stores n bits of information for each pixel, where n is an integer greater than one, which allows each pixel to have $2^n$ illumination states. One of the states is off, and in the other $2n-1$ states, the pixel is illuminated at different respective intensities. Thus, for example, a 4-bit deep raster scan memory can support fifteen levels of partial to maximum illumination (gray scale levels) as well as the dark or off state.

Depending on the nature of the signal and the settings of the oscilloscope, a given column of pixels may contain one or more illuminated pixels (hereinafter referred to as dots). Each column displays a vector, defined as the segment of the column between the uppermost dot in the column and the lowermost dot in the column.

The brightness of a vector depends on the sum of the intensities of the dots in the vector. If the intensity of a dot is proportional to the value of the data word stored in the corresponding location of the raster scan memory, the brightness of the vector is proportional to the sum of the data words of the dots in the vector. The brightness of the display is the sum of the brightnesses of all the vectors, and therefore is proportional to the sum of the data words of the dots in all the vectors.

The digital oscilloscope shown in FIG. 1 also includes an A/D converter 18 having an input terminal for acquiring an electrical signal at a test point in an electronic circuit. The A/D converter samples the signal during an acquisition interval and quantizes the samples to generate a sequence of digital data words. The data words generated by the A/D converter and having values D1–DN are stored as a linear waveform record in an acquisition memory 22 having a one-dimensional address space A1–AN.

When the acquisition is complete, the linear waveform record stored in the acquisition memory is supplied to a rasterizer 26 which generates a rasterized waveform record and stores it in a rasterizer memory 30 having a two-dimensional address space (X1–XN, Y1–YN). (The common suffix N is used for economy and is not intended to indicate that the number of elements in the set {Xi}, for example, is the same as the number of elements in the set {Ai}.) The X component of the address of a data word in the rasterized waveform record stored in the rasterizer memory 30 is derived from the address Ai of at least one word of the linear waveform record and the Y component of the address is derived from the value Di of at least one word of the linear waveform record.

Each combination of addresses (Xi, Yi) at which a data word is stored in the rasterizer memory 30 represents an event, characterized by a unique combination of time (dependent on Xi) and signal level (dependent on Yi).

The rasterized waveform record may be added to an existing display record stored in the raster scan memory 14 to control the state of the display panel 10. Referring to FIGS. 2A–2C, in which the numerical values designate decimal values of data words, FIG. 2A represents the original display record for three adjacent columns of the display panel prior to addition of the rasterized waveform record for a new acquisition, FIG. 2B represents the rasterized waveform record for the corresponding interval of the new acquisition, and FIG. 2C represents the updated display record obtained by adding the rasterized waveform record of FIG. 2B to the display record of FIG. 2A. Thus, if the same event occurs during multiple acquisitions, the value of the data word representing that event in the raster scan memory 14 increases.

As also shown in FIG. 1, the contents of the raster scan memory may be influenced by a decay process 34, which reduces the value stored at each location in the raster scan memory by a selected amount per unit time, so that events that occur only infrequently will be shown with reduced intensity as compared with events that occur more frequently.

The oscilloscope includes a controller 38, which controls operation of the other components shown in FIG. 1, and operator controls 42 which allow the user to adjust the settings of the oscilloscope.

In one known technique of rasterizing, referred to as the dot mode, the address (Xi, Yi) of a data word of the rasterized waveform record is derived from a single data-address pair of the linear waveform record. Thus, the data words in the rasterized waveform record correspond on a one-to-one basis with the data-address pairs of the linear waveform record.

It is generally considered desirable that the waveform presented to the user of an oscilloscope be substantially continuous, without significant horizontal or vertical gaps between dots. However, when the rasterizer operates in the dot mode, there may be gaps between dots in the display. Accordingly, depending on the signal and the settings of the oscilloscope, the dot mode of rasterizing may not be considered optimum.

In another known mode, referred to as the full vector mode, the rasterized waveform record includes not only data words derived respectively from the data-address pairs of the linear waveform record but also additional data words which are synthesized by the rasterizer to ensure that the waveform is continuous, so that an end point of a vector is offset vertically from the end point of an adjacent vector by no more than one pixel, and all the pixels between the two end points of the vector, as well as the two end points themselves, are illuminated.

U.S. Pat. No. 6,104,374, the entire disclosure of which is hereby incorporated by reference herein, discloses a sparse vector mode of rasterizing in which the end points of a vector may be vertically offset from an adjacent vector by more than one pixel and there may be a gap of one or more pixels between two dots in a given vector. Randomization is built into the sparse vector mode, so that even if the linear waveform records for successive acquisitions are identical, the respective rasterized waveform records will generally not be precisely the same, and gaps in a vector created on one acquisition will be filled in on a subsequent acquisition.

In a practical implementation of the oscilloscope described in U.S. Pat. No. 6,104,374, a variable that affects the operation of the rasterizer is known as the minimum attack amount, which is the minimum value of a non-zero data word in the rasterized waveform record. Depending on the nature of the linear waveform record, a non-zero data word in the rasterized waveform record may have a value (attack amount) greater than the minimum attack amount. Another variable affecting operation of the oscilloscope may be referred to as the decay rate, which is the amount by which the decay process 34 reduces the values of non-zero data words in the display record per unit time.

The decay rate and the minimum attack amount depend on values supplied by the controller 38 to the decay process 34 and the rasterizer 26 respectively.

In the practical implementation of the oscilloscope described in U.S. Pat. No. 6,104,374, a dot representing an event in a given signal channel has a selected color, such as red, and an unilluminated pixel is black. The brightness of the dot depends on the value of the data word at the corresponding location in the raster scan memory. At a high data value, the dot is vivid and as the data value decreases the dot fades to black through progressively deeper and darker shades. The value of the data word at a given location in the raster scan memory, and hence the brightness of the corresponding dot in the display, depends on the attack amount for the event represented by that location in the raster scan memory and on the decay rate. The display device can be adjusted to alter the brightness and contrast of the display. Contrast can indicate differences in frequency of events, since a pixel that is hit less frequently will be dimmer than a pixel that is hit more frequently. If the contrast value is low, the difference between the brightness of a pixel that is hit more frequently and the brightness of a pixel that is hit less frequently is reduced and accordingly all events appear to be the same. Further, contrast can indicate differences in edge rate of events: slower edges are shown more brightly than faster edges.

Three variables that characterize the manner in which a vector is displayed in the sparse vector mode of rasterizaton are referred to herein as vector weight VW, which is equal to the total value of the data words for the dots in a vector, raster weight W, which is equal to the units of intensity per attack (the amount by which the data value stored in the raster scan memory for a particular event is increased on the next occurrence of that event), and vector fill N, equal to the maximum number of dots in a vector.

In the sparse vector mode of rasterization, the value of VW is kept substantially constant over all vectors in order to keep the brightness of all vectors the same regardless of the length of the vector. If the actual number of dots in a vector is N, VW is equal to W*N. If the actual number of dots in a given vector is less than N, the value of W is increased for that vector in order to keep VW constant.

SUMMARY OF THE INVENTION

In accordance with the invention there is provided a method of operating a raster scan digital signal acquisition and waveform display instrument in which a dot representing a signal event is displayed with a color parameter in accordance with the value of a corresponding data word stored in a raster scan memory, the method comprising receiving a single color parameter control value from a user interface control element and generating multiple independent control values for influencing the values of the data words stored in the raster scan memory in response to said single color parameter control value.

BRIEF DESCRIPTION OF THE DRAWINGS

For a better understanding of the invention, and to show how the same may be carried into effect, reference will now be made, by way of example, to the accompanying drawings, in which.

Figure 1:
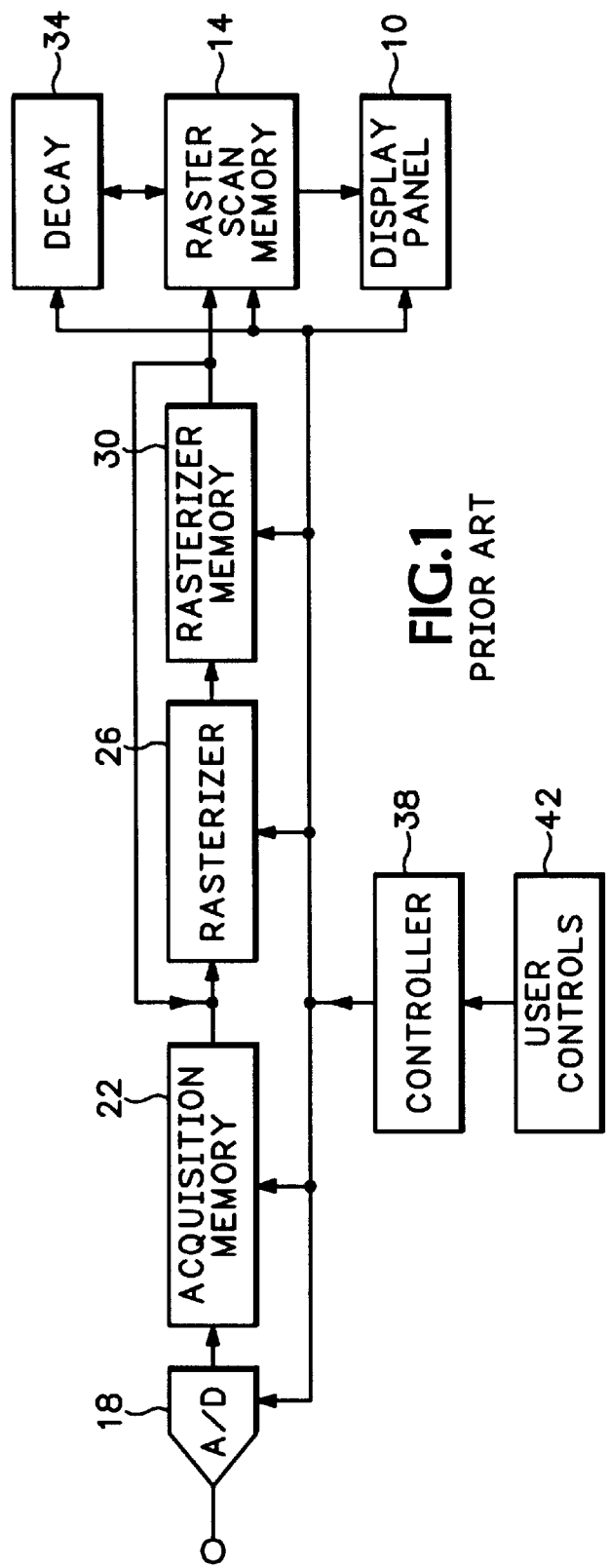
FIG. 1 is a block diagram illustrating some features of a digital oscilloscope in accordance with the prior art.
Figure 2A:
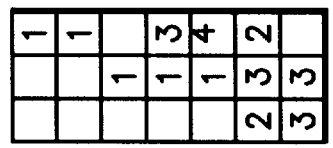
FIG. 2 illustrates operation of the oscilloscope shown in FIG. 1.
Figure 2B:
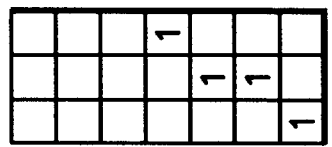
Figure 2C:
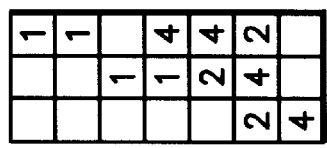
Figure 3:
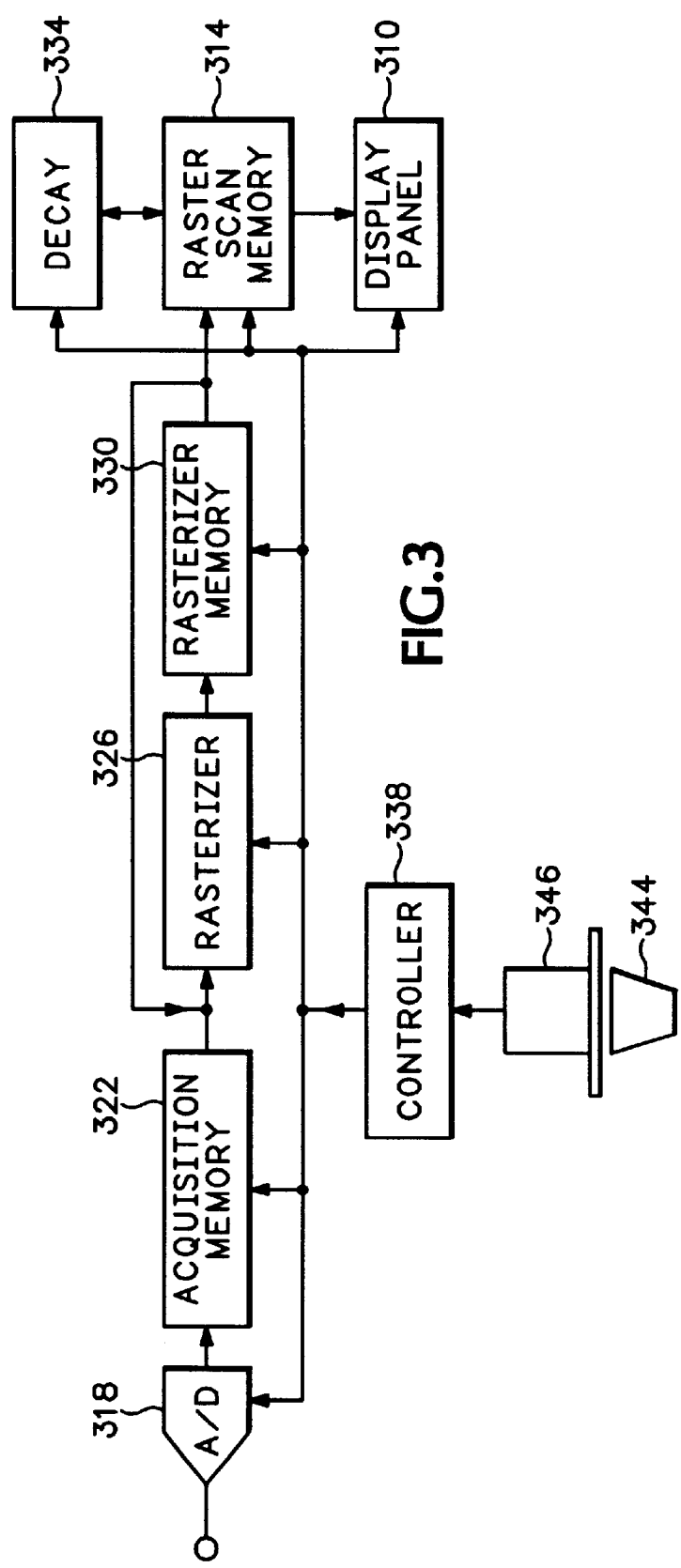
FIG. 3 is a block diagram illustrating some features of a digital oscilloscope in accordance with the present invention.

The arrangement of blocks shown in FIG. 3 has been selected to facilitate description of signal flow and does not necessarily correspond with the arrangement of blocks in a practical implementation of the invention.

DETAILED DESCRIPTION

It would be possible to provide multiple independent control knobs in the user interface of a digital oscilloscope, to allow independent control of the variables, such as vector weight and decay rate, that affect the appearance of the display, but this could create difficulty or resistance on the part of a user who is familiar with the interface of the conventional analog oscilloscope and accordingly is used to a single intensity control knob. It would also be possible to provide two control knobs, for controlling brightness and contrast respectively, but the ability to control brightness and contrast with a degree of independence would also be unfamiliar to many users.

The user controls of the oscilloscope shown in FIG. 3 include a knob 344 mechanically coupled to an angular position sensor 46 which provides a numerical output dependent on the angular position of the knob to the controller. The controller adjusts operating parameters of the rasterizer and the decay process in response to the numerical output of the position sensor.

Rotation of the control knob 344 from one extreme (fully counterclockwise or minimum) to the opposite extreme (fully clockwise or maximum) has three principal ranges. The manner in which the controller adjusts the operating parameters of the rasterizer and the decay process in the first and second principal ranges are selected to emulate the effect of rotating the intensity control knob of a conventional analog oscilloscope. Thus, in the first principal range, the maximum brightness increases while the minimum brightness remains substantially constant, and therefore the contrast (the ratio of maximum brightness to minimum brightness) also increases. In the second principal range, the maximum brightness initially continues to increase to saturation while the minimum brightness increases at substantially the same rate as the maximum brightness. In this part of the second range, contrast remains constant. In a second part of the second principal range, the minimum brightness continues to increase after maximum brightness has reached saturation so contrast then decreases and ultimately reaches zero when minimum brightness has attained saturation.

The operating parameters that are adjusted by the controller in response to the output of the angular position sensor are the decay rate for the decay process and the vector weight and minimum attack amount for the rasterizer. The attack amount for a given pixel is the greater of the minimum attack amount and the sum of the current data value for the pixel plus the fraction of which the vector weight is the numerator and the vector length is the denominator. The decay process reduces a data value in the raster scan memory either by multiplying the data value by a fraction less than one and writing the result back into the same memory location or by subtracting a constant from the data value and writing the result back into the same memory location.

In the first principal range, the controller increases vector weight evenly as the knob is rotated while decreasing decay rate at a relatively low rate and maintaining the minimum attack value constant. This has the effect of increasing both contrast and display brightness. The rate of increase of contrast (with knob rotation) may be somewhat less than the rate of increase of brightness.

In the second principal range, the controller increases the minimum attack value progressively to 50% saturation while continuing to increase the vector weight. The decay rate also is reduced during the second principal range. The increase in the minimum attack value results in the minimum initial brightness of any dot being 50% of its maximum, fully saturated, brightness. The effect of these measures is to increases the brightness, to assist the user in seeing infrequent or dim events. When the frequency of an event is such that the top of the contrast range reaches the saturation level, the contrast ratio is reduced as the control knob is turned further. By the end of the second principal range, most regular events will appear fully saturated and therefore have no contrast among them.

Within the first and second principal ranges, the decay rate changes only slowly, and its range of values is such that an infrequent event is shown as a dot that is initially bright (depending on the minimum attack value) and decays fairly rapidly to black.

If the user continues to turn the control knob beyond the second principal range, it can be inferred either that the user suspects that some events are occurring but have not been shown or that the user seeks to confirm that there are no additional events that should be seen. Therefore, in order to show less frequent events or dim events, such as occasional glitches, in the third principal range the decay rate is decreased rapidly as the knob is turned. If an infrequent event occurs when the knob is in the third principal range, its display will decay much more slowly than if the knob were in the first or second principal range. The effect of decreasing the decay rate in this manner is to increase the number of acquisitions contributing to the display.

In the first and second ranges, the rasterizer operates in accordance with the sparse vector mode described in co-pending Patent Application Ser. No. 09/106,382, filed Jun. 25, 1998 the entire disclosure of which is hereby incorporated by reference herein. In the third principal range, the rasterizer operates in the full vector mode in order to ensure that an event is displayed with maximum brightness.

When the knob is in the third range, there may be noticeable smearing or blurring of relatively frequent or bright events. The rate of change of the decay rate during the first and second ranges is selected so that the minimum value of the decay rate in the second range is sufficiently large that there will not be significant smearing or blurring in the second principal range.

The functions controlling both vector weight and minimum attack amount change at the end of the second principal range. In order to provide a smooth transition to the third principal range, the rate of change of the decay rate is reduced, preferably to zero, before the end of the second range.

Although the three principal ranges have been described as if the boundaries between the ranges were clearly defined, there may be some overlap between the ranges in order to avoid abrupt changes in the appearance of the display.

It will be appreciated that the invention is not restricted to the particular embodiment that has been described, and that variations may be made therein without departing from the scope of the invention as defined in the appended claims and equivalents thereof. For example, although the invention has been described with reference to an instrument in which the color parameter that is changed in response to rotation of the control knob is intensity, the invention is also applicable to an instrument, such as a color temperature display instrument, in which another parameter (hue in the case of a color temperature display instrument) is changed. In each case, the controller translates the numerical output of the angular position sensor, representing brightness, to a numerical value and maps the numerical value to a color.

What is claimed is:

1. A method of operating a raster scan digital signal acquisition and waveform display instrument in which a dot representing a signal event is displayed with a color parameter in accordance with the value of a corresponding data word stored in a raster scan memory, the method comprising:

receiving a single color parameter control value from a user interface control element and generating multiple independent control values for influencing the values of the data words stored in the raster scan memory in response to said single color parameter control value;

wherein the instrument has a rasterizer for increasing the value of the data word corresponding to an event by an amount returned by a first function on each occurrence of the event, and a decay machine for decreasing the values of all non-zero data words in the raster scan memory by an amount returned by a second function per unit time, and the method comprises supplying the single color parameter control value as inputs to both the first function and the second function.

2. A method of operating a raster scan digital signal acquisition and waveform display instrument in which a dot representing a signal event is displayed with a color parameter in accordance with the value of a corresponding data word stored in a raster scan memory, the method comprising:

receiving a single color parameter control value from a user interface control element and generating multiple independent control values for influencing the values of the data words stored in the raster scan memory in response to said single color parameter control value;

wherein the user interface control element has at least one operating range in which the effect of increasing the single color parameter control value is to increase maximum brightness while maintaining minimum brightness substantially constant.

3. A method according to claim 2, wherein the instrument has a rasterizer for increasing the value of the data word corresponding to an event by an amount returned by a first function on each occurrence of the event, and a decay machine for decreasing the values of all non-zero data words in the raster scan memory by an amount returned by a second function per unit time, and the method comprises supplying the single color parameter control value as inputs to both the first function and the second function and wherein the first function increases vector weight evenly in said one range.

4. A method of operating a raster scan digital signal acquisition and waveform display instrument in which a dot representing a signal event is displayed with a color parameter in accordance with the value of a corresponding data word stored in a raster scan memory the method comprising:

receiving a single color parameter control value from a user interface control element and generating multiple independent control values for influencing the values of the data words stored in the raster scan memory in response to said single color parameter control value;

wherein the user interface control element has at least one operating range in which the effect of increasing the single color parameter control value is to increase maximum brightness at a first rate while increasing minimum brightness at a second rate which is substantially lower than the first rate.

5. A method of operating a raster scan digital signal acquisition and waveform display instrument in which a dot representing a signal event is displayed with a color parameter in accordance with the value of a corresponding data word stored in a raster scan memory the method comprising:

receiving a single color parameter control value from a user interface control element and generating multiple independent control values for influencing the values of the data words stored in the raster scan memory in response to said single color parameter control value;

wherein the user interface control element has at least one operating range in which the effect of increasing the single color parameter control value is to increase both maximum brightness and minimum brightness.

6. A method according to claim 5, wherein said one range has a first subrange in which the effect of increasing the single color parameter control value is to increase both maximum brightness and minimum brightness and a second subrange in which the effect of increasing the single color parameter control value is to increase minimum brightness while maintaining maximum brightness substantially constant.

7. A method according to claim 5, wherein the instrument has a rasterizer for increasing the value of the data word corresponding to an event by an amount returned by a first function on each occurrence of the event, and a decay machine for decreasing the values of all non-zero data words in the raster scan memory by an amount returned by a second function per unit time, and the method comprises supplying the single color parameter control value as inputs to both the first function and the second function and wherein the first function increases vector weight evenly in said one range and the second function decreases decay rate in said one range.

8. A method according to claim 7, wherein the first function increases minimum attack amount in said one range.

9. A method of operating a raster scan digital signal acquisition and waveform display instrument in which a dot representing a signal event is displayed with a color parameter in accordance with the value of a corresponding data word stored in a raster scan memory, the method comprising:

receiving a single color parameter control value from a user interface control element and generating multiple independent control values for influencing the values of the data words stored in the raster scan memory in response to said single color parameter control value;

wherein the user interface control element has at least a first operating range in which the effect of increasing the single color parameter control value is to increase maximum brightness while maintaining minimum brightness substantially constant and a second operating range in which the effect of increasing the single color parameter control value is to increase both maximum brightness and minimum brightness.

10. A method of operating a raster scan digital signal acquisition and waveform display instrument in which a dot representing a signal event is displayed with a color parameter in accordance with the value of a corresponding data word stored in a raster scan memory, the method comprising:

receiving a single color parameter control value from a user interface control element and generating multiple independent control values for influencing the values of the data words stored in the raster scan memory in response to said single color parameter control value;

wherein the user interface control element has at least one operating range in which the effect of increasing the single color parameter control value is to increase minimum brightness while maintaining maximum brightness substantially constant.

11. A method according to claim 10, wherein said one range has a first subrange in which the effect of increasing the single color parameter control value is to increase minimum brightness while maintaining maximum brightness substantially constant and a second subrange in which the effect of increasing the single color parameter control value is to maintain both maximum brightness and minimum brightness substantially constant while increasing persistence.

12. A method according to claim 10, wherein the instrument has a rasterizer for increasing the value of the data word corresponding to an event by an amount returned by a first function on each occurrence of the event, and a decay machine for decreasing the values of all non-zero data words in the raster scan memory by an amount returned by a second function per unit time, and the method comprises supplying the single color parameter control value as inputs to both the first function and the second function and wherein the first function maintains vector weight substantially constant in said one range and the second function decreases decay rate in said one range.

13. A method of operating a raster scan digital signal acquisition and waveform display instrument in which a dot representing a signal event is displayed with a color parameter in accordance with the value of a corresponding data word stored in a raster scan memory, the method comprising:

receiving a single color parameter control value from a user interface control element and generating multiple independent control values for influencing the values of the data words stored in the raster scan memory in response to said single color parameter control value;

wherein the user interface control element has at least one operating range in which the effect of increasing the single color parameter control value is to increase brightness of infrequent dots independently of current brightness of or contrast with other portions of the display.

14. A method of operating a raster scan digital signal acquisition and waveform display instrument in which a dot representing a signal event is displayed with a color parameter in accordance with the value of a corresponding data word stored in a raster scan memory the method comprising:

receiving a single color parameter control value from a user interface control element and generating multiple independent control values for influencing the values of the data words stored in the raster scan memory in response to said single color parameter control value;

wherein the user interface control element has at least a first operating range in which the effect of increasing the single color parameter control value is to increase maximum brightness while maintaining minimum brightness substantially constant, a second operating range in which the effect of increasing the single color parameter control value is to increase both maximum brightness and minimum brightness, and a third operating range in which the effect of increasing the single color parameter control value is to increase minimum brightness while maintaining maximum brightness substantially constant.

15. A method according to claim 14, wherein said third range has a first subrange in which the effect of increasing the single color parameter control value is to increase minimum brightness while maintaining maximum brightness substantially constant and a second subrange in which the effect of increasing the single color parameter control value is to maintain both maximum brightness and minimum brightness substantially constant while increasing persistence.

16. A method according to claim 1, wherein the color parameter is intensity.

17. A method according to claim 1, wherein the color parameter is hue.

* * * * *